United States Patent
Yakimov et al.

(10) Patent No.: US 10,114,129 B2
(45) Date of Patent: Oct. 30, 2018

(54) SEMICONDUCTOR DETECTOR FOR X-RAY SINGLE-PHOTON DETECTION

(71) Applicant: THE RESEARCH FOUNDATION FOR THE STATE UNIVERSITY OF NEW YORK, Albany, NY (US)

(72) Inventors: Michael Yakimov, Ballston Lake, NY (US); Serge Oktyabrsky, Rexford, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 93 days.

(21) Appl. No.: 15/416,894

(22) Filed: Jan. 26, 2017

(65) Prior Publication Data

US 2017/0219723 A1 Aug. 3, 2017

Related U.S. Application Data

(60) Provisional application No. 62/288,277, filed on Jan. 28, 2016.

(51) Int. Cl.
*G01T 1/24* (2006.01)
*H01L 27/146* (2006.01)

(52) U.S. Cl.
CPC ............. *G01T 1/243* (2013.01); *G01T 1/241* (2013.01); *H01L 27/14603* (2013.01); *H01L 27/14659* (2013.01)

(58) Field of Classification Search
CPC ... G01T 1/243; G01T 1/241; H01L 27/14603; H01L 27/14659
See application file for complete search history.

(56) References Cited

U.S. PATENT DOCUMENTS 5,001,536 A * 3/1991 Fukuzawa ........... H01L 27/0605
257/192
5,512,756 A * 4/1996 Bayer ....................... G01T 1/24
250/370.12

(Continued)

OTHER PUBLICATIONS

Niclass, et al., "Design and Characterization of a CMOS 3-D Image Sensor Based on Single Photon Avalanche Diodes," IEEE Journal of Solid-State Circuits, vol. 40, No. 9, Sep. 2005, pp. 1847-1854.

(Continued)

*Primary Examiner* — Casey Bryant
(74) *Attorney, Agent, or Firm* — Wayne F. Reinke, Esq.; Heslin Rothenberg Farley & Mesiti P.C.

(57) ABSTRACT

A detector for detecting a single x-ray photon with high temporal resolution and high efficiency includes a semiconductor substrate, the semiconductor substrate including element(s) from each of Groups III and V of the Periodic Table of Elements, and pixels on the substrate. Each pixel includes a semiconductor transistor including an epitaxial layer having element(s) from each of Groups III and V of the Periodic Table of Elements, an anode electrically connected to a gate of the semiconductor transistor, and a cathode electrically connected to a drain of the semiconductor transistor. Photon(s) are caused to impinge the single-photon detector along a y-direction (long side of pixel) to provide adequate stopping power, and electron-hole pairs generated by the photon(s) are collected along an x-direction or z-direction (short sides of pixel) to provide short transit time. Detectors form an array of pixels for x-ray imaging with temporal resolution of single photons.

20 Claims, 3 Drawing Sheets

(56) References Cited

U.S. PATENT DOCUMENTS

| | | | | |
|---|---|---|---|---|
| 6,121,622 | A * | 9/2000 | Beyne | H01J 47/02 |
| | | | | 250/338.4 |
| 6,933,503 | B2 * | 8/2005 | Sipila | H01L 27/14659 |
| | | | | 250/370.09 |
| 2004/0007671 | A1 * | 1/2004 | Sipila | H01L 27/14659 |
| | | | | 250/370.01 |
| 2004/0146138 | A1 * | 7/2004 | Jiao | G01T 1/2018 |
| | | | | 378/19 |
| 2017/0219501 | A1 * | 8/2017 | Yakimov | G01N 23/203 |

OTHER PUBLICATIONS

Wang, et al., "Towards hard x-ray imaging at GHz frame rate," Review of Scientific Instruments 83, 10ES10 (2012) (4 pages).

U.S. Army Medical Research and Material Command Broad Agency, Decreasing Patient Radiation Dose from CT Imaging: Achieving Sub-mSv Studies (U01), Opp ID: 126766, Collaboration or Cooperative Agreement Research Contract or Tender, Last edited on Jun. 14, 2013 (15 pages).

Oguz, et al., "Ultrafast time resolved x-ray diffraction, extended x-ray absorption fine structure and x-ray absorption near edge structure," Irvine, California, JAP 112, 031101, 2012 (16 pages).

Sellin, et al., "Characterisation of charge transport in compound semiconductor detectors," University of Surrey, Guildford, UK (29 slides).

El-Abbassi, et al., "Characterisation of vertical gradient freeze semi-insulating InP for use as a nuclear radiation detector," Nuclear Instruments and Methods in Physics Research, A 466 (2001), p. 47-51.

* cited by examiner

SEMICONDUCTOR DETECTOR FOR X-RAY SINGLE-PHOTON DETECTION

CROSS-REFERENCE TO RELATED APPLICATIONS

This application claims priority under 35 U.S.C. § 119 to U.S. Provisional Application No. 62/288,277, filed Jan. 28, 2016, which is herein incorporated by reference in its entirety.

BACKGROUND OF THE INVENTION

Technical Field

The present invention generally relates to semiconductor detectors. More particularly, the present invention relates to x-ray single-photon semiconductor detectors.

SUMMARY OF THE INVENTION

The shortcomings of the prior art are overcome and additional advantages are provided through the provision, in one aspect, of a detector for detecting a single x-ray photon. The detector includes a semiconductor substrate, the semiconductor substrate including at least one element from each of Groups III and V of the Periodic Table of Elements, and a plurality of pixels on the substrate, each pixel including a semiconductor diode fabricated on the substrate, a semiconductor transistor having an epitaxial layer including at least one element from each of Groups III and V of the Periodic Table of Elements, one electrode of the semiconductor diode electrically connected to a gate of the semiconductor transistor, and a second electrode of the semiconductor diode electrically connected to a drain of the semiconductor transistor.

In accordance with another aspect, a method is provided. The method includes providing a single-photon x-ray detector, the detector including a semiconductor substrate, the semiconductor substrate including at least one element from each of Groups III and V of the Periodic Table of Elements, and a plurality of pixels on the substrate. Each pixel includes a semiconductor diode fabricated on the substrate, a semiconductor transistor including an epitaxial layer having at least one element from each of Groups III and V of the Periodic Table of Elements, one electrode of the semiconductor diode electrically connected to a gate of the semiconductor transistor, and a second electrode of the semiconductor diode electrically connected to a drain of the semiconductor transistor. An electric field is applied to one or more pixels between the one electrode and the second electrode in a x-z plane along a x-axis or z-axis of the x-z plane, and at least one x-ray photon impinges one or more pixels along the y-axis at an angle.

These, and other objects, features and advantages of this invention will become apparent from the following detailed description of the various aspects of the invention taken in conjunction with the accompanying drawings.

DETAILED DESCRIPTION OF THE INVENTION

Figure 1:
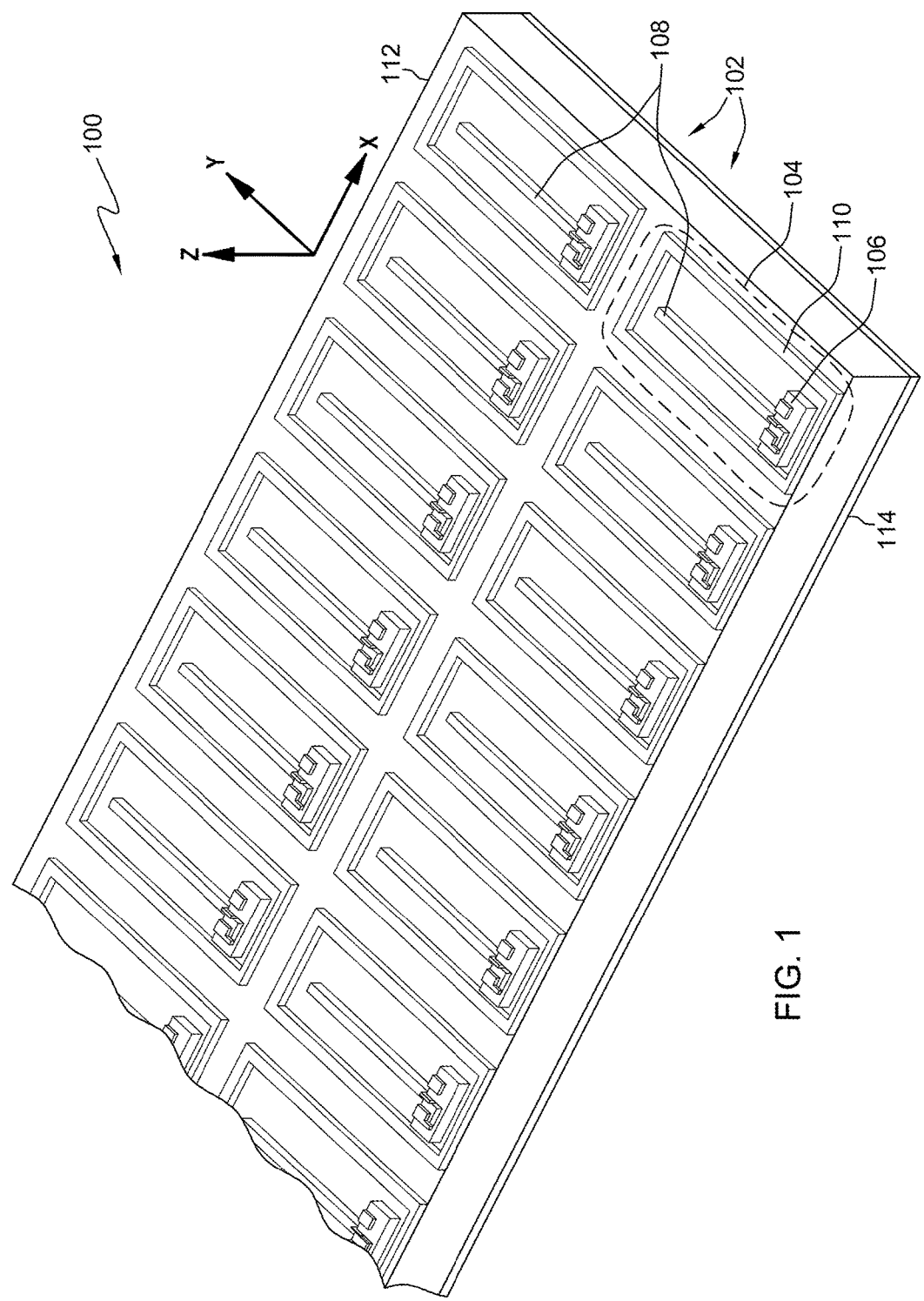
FIG. 1 depicts one example of a portion of a single-photon detector array, the array including multiple pixels, in accordance with one or more aspects of the present invention. Each pixel includes a transistor, an anode and a cathode, the anode connected to the transistor. The pixels are situated on a semiconductor substrate.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

The present invention provides, in one aspect, detector for detecting a single x-ray photon with high temporal resolution and high efficiency. The detector includes a semiconductor substrate, the semiconductor substrate including at least one element from each of Groups III and V of the Periodic Table of Elements, and a plurality of pixels on the substrate. Each pixel includes a semiconductor diode fabricated on the substrate, with one of the electrodes electrically connected to a gate of a semiconductor transistor fabricated on an epitaxial layer and including at least one element from each of Groups III and V of the Periodic Table of Elements. Each semiconductor diode includes two electrodes to apply electric potential along a short dimension of the detector to collect photoelectrons with short transit time, while the x-ray photons are impinging along the long dimension of the detector to provide adequate stopping power and, therefore, high efficiency of energy transfer from x-ray photons to photoelectrons.

The present invention provides, in another aspect, a method of detecting a single x-ray photon with high temporal resolution and high efficiency. The method includes providing a single-photon detector. The detector includes a semiconductor substrate, the semiconductor substrate including at least one element from each of Groups III and V of the Periodic Table of Elements. The single-photon detector further includes one electrode, for example a cathode, connected to a portion of a top surface or a bottom surface, or both, of the semiconductor substrate, and a plurality of pixels on the substrate. Each pixel includes a semiconductor transistor including an epitaxial layer having at least one element from each of Groups III and V of the Periodic Table of Elements, another electrode, for example, an anode, electrically connected to a gate of the semiconductor transistor, and, for example, a cathode electrically connected to a drain of the semiconductor transistor. The method further includes causing at least one x-ray photon to impinge the single-photon detector along a long dimension of the detector, providing adequate stopping power of x-rays for high-efficiency detection, collecting photoelectrons created by at least one x-ray photon in the detector by applying the electric field along short dimension of the detector to reduce transit time of photoelectrons, and detecting at least one photon by one or more of the plurality of pixels.

FIG. 1 depicts one example of a portion of a single-photon detector array 100, the array including multiple pixels 102, in accordance with one or more aspects of the present invention. Each pixel (e.g., pixel 104) includes a semiconductor diode fabricated on a semiconductor substrate 112, the substrate including, for example, at least one element from each of Groups III and V of the Periodic Table of Elements, e.g., indium phosphide or gallium arsenide. Each semiconductor diode includes two electrodes to apply electric potential along a short dimension of the detector (in the x direction or x-z plane) to collect photoelectrons with a short transit time. The single-photon detector further includes one electrode, for example, a cathode, connected to a portion of top surface 110 or bottom surface 114 or both of the semiconductor substrate. Another electrode, for example, an anode, is electrically connected to a gate of the semiconductor transistor 106, and, for example, a cathode electrically connected to a drain of the semiconductor transistor.

Figure 2:
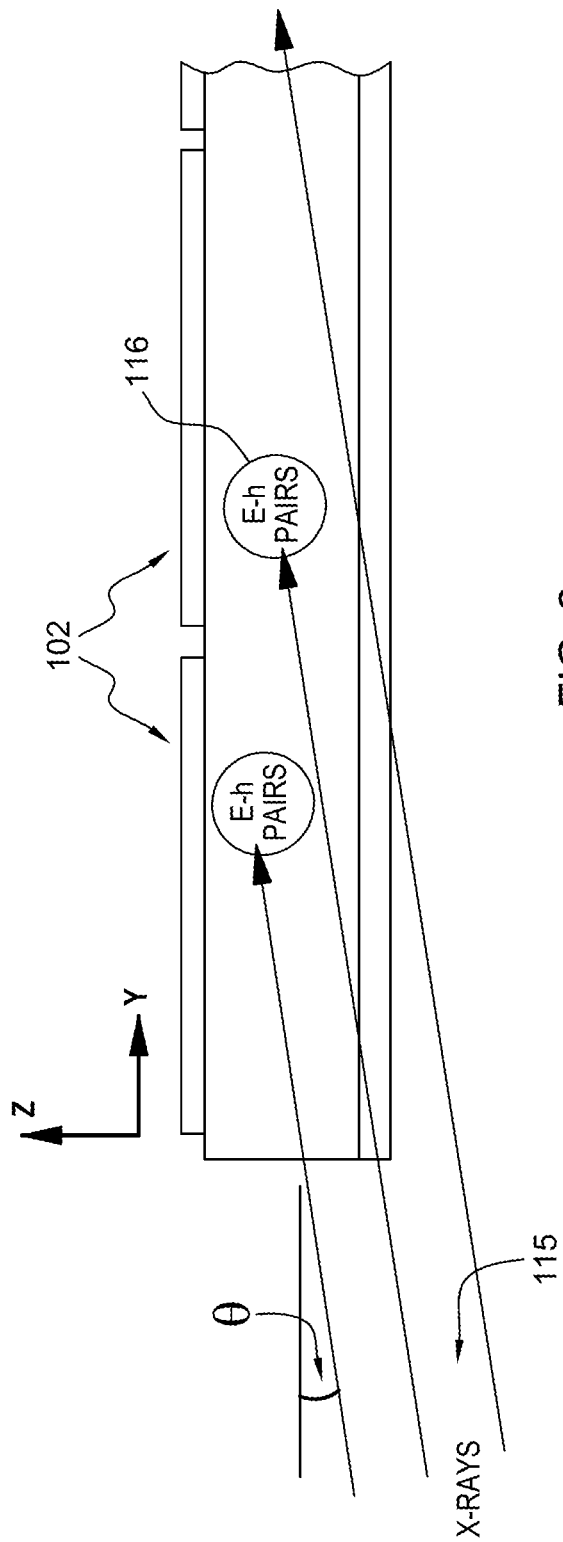
FIG. 2 is a partial end view of one example of the single-photon detector array of FIG. 1 in the y-z plane, including multiple pixels, where the x-ray photons are impinging along a long dimension of the detector, the x-ray photons are angled with respect to the y-direction to provide adequate stopping power and, therefore, high efficiency of energy transfer from x-ray photons to electron-hole pairs in the semiconductor, in accordance with one or more aspects of the present invention.

FIG. 2 is a partial end view of one example of the single-photon detector array of FIG. 1 in the y-z plane, including multiple pixels 102, where the x-ray photons 115 are impinging along a long dimension of the rectangular detector, the x-ray photons are angled with respect to the y-direction to provide adequate stopping power and, therefore, high efficiency of energy transfer from x-ray photons to electron-hole pairs in the semiconductor, in accordance with one or more aspects of the present invention. It will be understood that, although shown as rectangular in the examples, the detector could be shaped otherwise.

Figure 3:
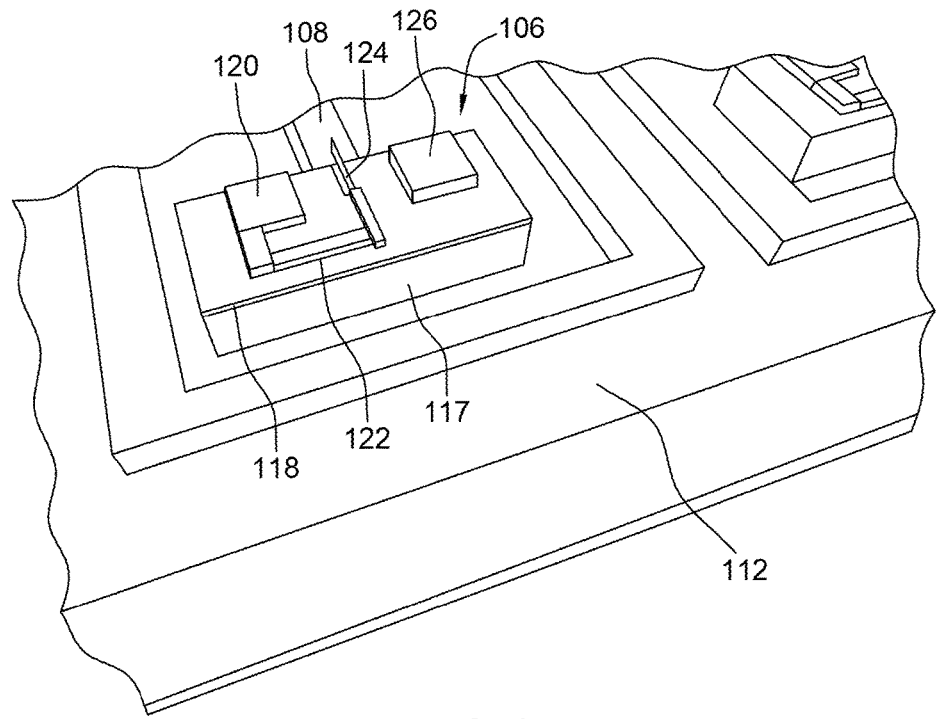
FIG. 3 depicts details of one example of a transistor useful with the array of FIG. 1, the transistor including a substrate, with a passivation layer thereover, a source contact electrically connected to a resistor (ground), a gate contact electrically connected to the anode, the resistor, the source contact and a drain contact, in accordance with one or more aspects of the present invention.

FIG. 3 depicts one example of transistor 106 from FIG. 1 in more detail, in accordance with one or more aspects of the present invention. The transistor includes an epitaxial layer 117 grown on a semiconductor substrate 112, with a passivation layer 118 thereover, a source contact 120 electrically connected to a resistor (ground) 122, a gate contact 124 electrically connected to the anode 108, the resistor, the source contact and a drain contact 126. The transistor may be fabricated, for example, in the form of a high-electron mobility transistor (HEMT) or metal-oxide-semiconductor field effect transistor (MOSFET), or combination of both (MOS-HEMT), for example, using conventional processes and techniques. However, the transistor must be of high mobility, such that a transistor based on silicon would not, at least currently, be an option. In one example, the epitaxial layer includes indium gallium arsenide. In another example, the epitaxial layer includes multiple layers of indium gallium arsenide and indium aluminum arsenide interspersed. The passivation layer may include, for example, a nitride or oxide (e.g., SiN or $Al_2O_3$).

Figure 4:
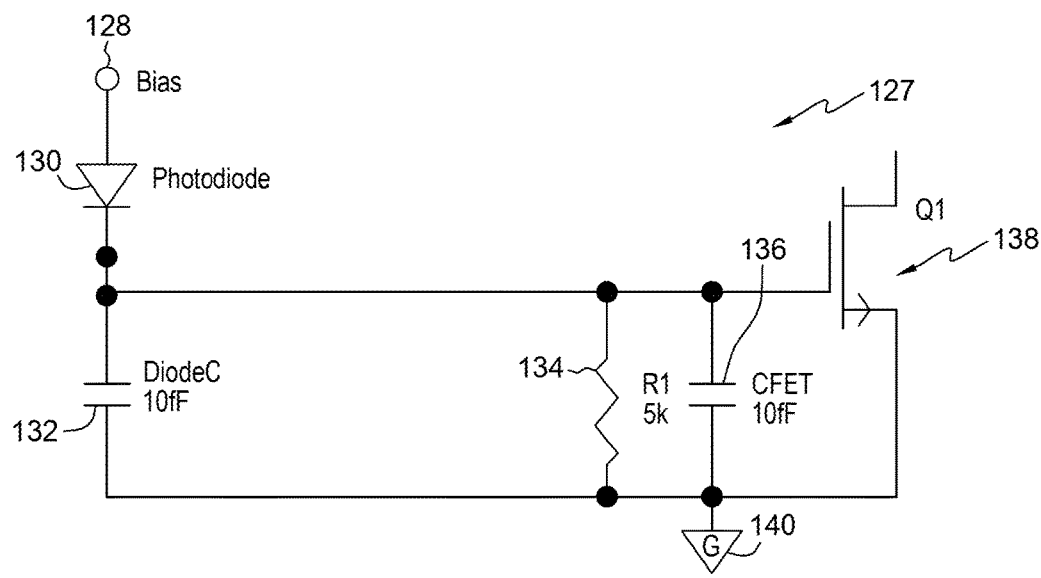
FIG. 4 depicts one example of an equivalent circuit for a pixel in FIG. 1, with a desired speed of 100 picoseconds or faster, the equivalent circuit including voltage bias, a photodiode electrically connected to a first capacitor, a shunt resistor and a second capacitor, the first capacitor, resistor and second capacitor connected in parallel, and a transistor, each electrically connected to ground, in accordance with one or more aspects of the present invention.

FIG. 4 depicts one example of an equivalent circuit 127 for a pixel in FIG. 1, with a desired speed of 100 picoseconds or faster, the equivalent circuit including voltage bias 128, a photodiode 130 electrically connected to a first capacitor 132 that includes the diode and parasitic input capacitance, a shunt resistor 134 and a second input transistor capacitor 136, the first cap, resistor and second cap connected in parallel, and a transistor 138, each electrically connected to ground 140, in accordance with one or more aspects of the present invention.

In the case of the desired speed of 100 picoseconds, in one example, each capacitor may have a capacitance of 10 femtofarads (fF), and the shunt resistor may have a resistance of 5 kOhm.

In a first aspect, disclosed above is a detector for detecting a single x-ray photon. The detector includes a semiconductor substrate, the semiconductor substrate including element(s) from each of Groups III and V of the Periodic Table of Elements, and pixels on the substrate. Each pixel includes a semiconductor diode fabricated on the substrate, a semiconductor transistor including an epitaxial layer having element(s) from each of Groups III and V of the Periodic Table of Elements, one electrode of the diode is, for example, electrically connected to a gate of the semiconductor transistor, and a second electrode of the diode is electrically connected to a drain of the semiconductor transistor.

In one example, the pixels may form, for example, a matrix to provide, for example, an x-ray single photon image with a temporal resolution of the x-ray photons.

In one example, the detector of the first aspect may further include, for example, an electric field applied to an x-direction or z-direction of each pixel and x-ray photon(s) impinging each pixel along a y-direction at an angle.

In one example, the semiconductor transistor of the detector in the first aspect may include, for example, indium gallium arsenide.

In one example, the detector in the first aspect may further include, for example, a semiconductor circuit coupled to the detector for determining a time-of-flight of a detected photon from an object being imaged to the detector. In one example, the semiconductor circuit is silicon-based and integrated with the detector.

In one example, the detector(s) of the first aspect may form, for example, an array.

In one example, the semiconductor transistor of the detector in the first aspect may include, for example, layer(s) of indium gallium arsenide and layer(s) of indium aluminum arsenide.

In one example, the semiconductor transistor of the detector in the first aspect may include, for example, layer(s) of indium gallium arsenide and layer(s) of gallium aluminum arsenide.

In one example, the substrate of the detector in the first aspect may include, for example, indium phosphide.

In another example, the substrate of the detector in the first aspect may include, for example, gallium arsenide.

In one example, each pixel of the detector in the first aspect may have, for example, a size of about 10 microns to about 100 microns.

In one example, the semiconductor transistor of the detector in the first aspect may include, for example, a nitride or oxide passivation layer.

In one example, the detector of the first aspect may further include, for example, a back cathode connected to a bottom surface of the semiconductor substrate.

In one example, the detector of the first aspect may further include, for example, heterojunction(s) to modulate an electrostatic potential profile in the detector.

In another example, the substrate of the detector of the first aspect may be relatively thin to further reduce a transit time of electrons in the detector.

In a second aspect, disclosed above a method is provided. The method includes providing a single-photon x-ray detector, causing photon(s) to impinge the single-photon x-ray detector, and detecting the photon(s) by pixels. The detector includes a semiconductor substrate, the semiconductor substrate including element(s) from each of Groups III and V of the Periodic Table of Elements. The detector further includes pixels on the substrate. Each pixel includes a semiconductor diode fabricated on the substrate, a semiconductor transistor including an epitaxial layer of III-V semiconductor materials. One electrode of the diode, for example, a cathode, is electrically connected to a gate of the transistor and a second electrode of the semiconductor diode electrically connected to a drain of the semiconductor transistor. An electric field is applied to one or more pixels between the one electrode and the second electrode in a x-z plane along a x-axis or z-axis of the x-z plane, and x-ray photon(s) impinge pixel(s) along the y-axis at an angle.

In one example, causing the photon(s) to impinge may include, for example, backscattering the photon(s) from an object. In one example, the photon(s) may be, for example, emitted from a source toward the object.

In one example, the detector may further include, for example, a circuit for determining a time-of-flight of a detected photon from emission to detection, and the method may further include, for example, determining a time-of-flight for a single x-ray photon, and the method may further include, for example, determining a three-dimensional x-ray image of an object.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A detector for detecting a single x-ray photon, the detector comprising:
   a semiconductor substrate, the semiconductor substrate comprising at least one element from each of Groups III and V of the Periodic Table of Elements; and
   a plurality of pixels on the substrate, each pixel comprising:
      a semiconductor diode fabricated on the substrate;
      a semiconductor transistor comprising an epitaxial layer having at least one element from each of Groups III and V of the Periodic Table of Elements;
      one electrode of the semiconductor diode electrically connected to a gate of the semiconductor transistor; and
      a second electrode of the semiconductor diode electrically connected to a drain of the semiconductor transistor.

2. The detector of claim 1, wherein the plurality of pixels forms a matrix.

3. The detector of claim 1, further comprising, an electric field applied to an x-direction or z-direction of each pixel and at least one x-ray photon impinging each pixel along a y-direction at an angle.

4. The detector of claim 1, wherein the semiconductor transistor comprises indium gallium arsenide.

5. The detector of claim 1, further comprising a semiconductor circuit coupled to the detector for determining a time-of-flight of a detected photon from an object being imaged to the detector.

6. The detector of claim 4, wherein the detector is integrated with a silicon-based semiconductor circuit.

7. The detector of claim 1, wherein a plurality of the detector forms an array.

8. The detector of claim 1, wherein the semiconductor transistor comprises at least one layer of indium gallium arsenide and at least one layer of indium aluminum arsenide.

9. The detector of claim 1, wherein the semiconductor transistor comprises at least one layer of indium gallium arsenide and at least one layer of gallium aluminum arsenide.

10. The detector of claim 1, wherein the semiconductor substrate of the detector comprises indium phosphide.

11. The detector of claim 1, wherein the semiconductor substrate of the detector comprises gallium arsenide.

12. The detector of claim 1, wherein each pixel has a size of about 10 microns to about 100 microns.

13. The detector of claim 1, wherein the semiconductor transistor comprises a nitride or oxide passivation layer.

14. The detector of claim 1, further comprising a back cathode connected to a bottom surface of the semiconductor substrate.

15. The detector of claim 1, further comprising at least one heterojunction to modulate an electrostatic potential profile in the detector.

16. The detector of claim 1, wherein the semiconductor substrate is thin relative to other layers of the detector.

17. A method, comprising:
providing a single-photon x-ray detector, the detector comprising:
a semiconductor substrate, the semiconductor substrate comprising at least one element from each of Groups III and V of the Periodic Table of Elements;
a plurality of pixels on the substrate, each pixel comprising:
a semiconductor diode fabricated on the substrate;
a semiconductor transistor comprising an epitaxial layer having at least one element from each of Groups III and V of the Periodic Table of Elements;
one electrode of the semiconductor diode electrically connected to a gate of the semiconductor transistor; and
a second electrode of the semiconductor diode electrically connected to a drain of the semiconductor transistor;
wherein, an electric field is applied to one or more pixels between the one electrode and the second electrode in a x-z plane along a x-axis or z-axis of the x-z plane, and wherein at least one x-ray photon impinges one or more pixels along the y-axis at an angle;
causing at least one photon to impinge the single-photon detector; and
detecting the at least one photon by one or more of the plurality of pixels.

18. The method of claim 17, wherein causing the at least one photon to impinge comprises backscattering the at least one photon from an object.

19. The method of claim 18, wherein the at least one photon is emitted from a source toward the object.

20. The method of claim 19, wherein the detector further comprises a circuit for determining a time-of-flight of a detected photon from emission to detection, the method further comprising determining a time-of-flight for a single photon.

* * * * *